United States Patent [19]

Pruitt

[11] 4,095,212
[45] June 13, 1978

[54] REMOTE ELECTRIC STATE TESTER

[76] Inventor: Billy Paul Pruitt, 3511 La Prada, Mesquite, Tex. 75150

[21] Appl. No.: 810,498

[22] Filed: Jun. 27, 1977

[51] Int. Cl.² .............................................. G08B 1/08
[52] U.S. Cl. ..................................... 340/224; 340/214; 325/67; 324/51
[58] Field of Search ............... 340/213 R, 214, 222, 340/224, 225, 248 R, 253 R, 253 C, 256, 411, 419; 324/51, 52, 73 AT, 76 R, 158 F; 325/67

[56] References Cited

U.S. PATENT DOCUMENTS

| 2,142,304 | 1/1939 | Cummings | 324/52 |
| 2,698,921 | 1/1955 | Wharton | 324/52 |

Primary Examiner—Alvin H. Waring
Attorney, Agent, or Firm—Hubbard, Thurman, Turner, Tucker & Glaser

[57] ABSTRACT

A tester for determining the state of an electric circuit at a location remote from the circuit is disclosed. The tester includes a transmitter connected to the circuit to be tested which transmits a different output signal for each state of the circuit to be tested and a combination receiver-indicator which is responsive to the output signals as transmitted from the transmitter.

7 Claims, 4 Drawing Figures

REMOTE ELECTRIC STATE TESTER

BACKGROUND OF THE INVENTION

This invention relates to the testing of the condition of an electric circuit at a location remote from that circuit and in one of its aspects to a remote live circuit tester.

Electricians, air conditioner repairmen, and others working with electrical systems such as those in homes or offices frequently need to turn power off in certain circuits such as turning the power off at a certain wall receptacle or at a thermostat. Normally, the power needs to be turned off at a fuse box or breaker box which is not within sight of the circuit in question. The repairman thus begins an iterative routine of turning off the breaker which he believes is the correct one and then returning to the circuit in question and testing that circuit with his voltmeter. If the voltmeter indicates that the power is still on at that circuit, then the repairman returns to the breaker box, turns on the breaker just turned off and turns off a different breaker. He then returns to the circuit in question and again tests that circuit with his voltmeter. Regularly, this leads to extreme situations such as when the circuit in question can only be accessed from the attic or from on top of the roof of the house. Regularly, this leads to multiple trips up and down a ladder and in an out of a house.

It is thus an object of this invention to save the time of people working with electricity by providing a method for determining the condition of a circuit at a location remote from that circuit.

The apparatus of this invention includes a transmitter with an output responsive to the circuit to be tested. The output of the transmitter has a plurality of states corresponding to the various states of interest of the circuit to be tested such as a state of transmitting a constant signal when power is on and a state of not transmitting any signal corresponding to when power is off.

The tester of this invention also includes a receiver which is responsive to the output states transmitted from the transmitter and an indicator responsive to the states received by the receiver. The indicator includes some form of indicating device such as a light or a meter.

Thus, a remote live circuit tester according to this invention will include a transmitter which can be plugged into the outlet in question or connected across the terminals in question and left while a repairman takes the combination receiver-indicator with him to the breaker box. As long as the circuit in question has power to it, and the receiver-indicator is turned on, the indicator will indicate to the repairman that the circuit is still live. When the repairman turns off the correct breaker, then the indicator will indicate that power to the circuit has been turned off. The repairman can then return to the circuit in question and as an added safety precaution, test the circuit with his voltmeter.

BRIEF DESCRIPTION OF THE DRAWINGS

These and other objects, advantages and features of this invention will be apparent from the following description taken with reference to the accompanying drawings, wherein is shown the preferred embodiments of the invention.

DESCRIPTION OF THE PREFERRED EMBODIMENTS

Figure 1:
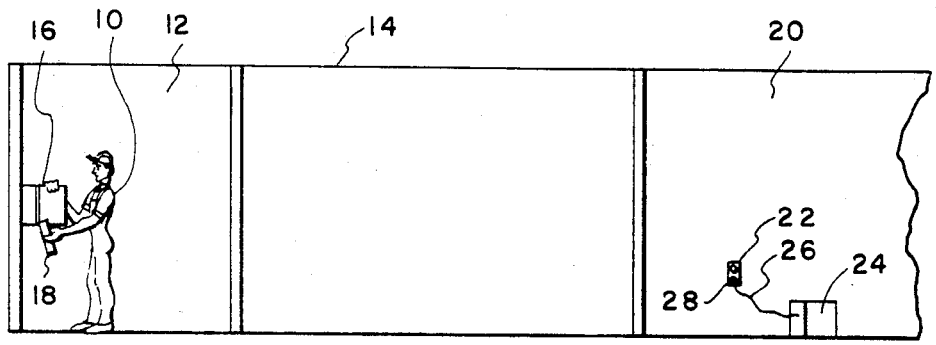
FIG. 1 is a pictorial representation of a repairman using a remote live circuit tester utilizing this invention.

Referring now to the drawings, in FIG. 1, a repairmann 10 stands in one room 12 of a house 14 in front of a breaker box 16. Repairman 10 holds a combination receiver-indicator 18 according to this invention in his left hand. At the far end of the house in a remote room 20, out of sight of the repairman, is a wall receptacle 22. A transmitter 24 in accordance with this invention is responsive to the condition of the electric circuit at outlet 22 by a means for electrically connecting the circuit to be tested to the input of the transmitter such as an electrical cord 26 and plug 28.

As long as power is available at outlet 22 and, therefore, to transmitter 24, then transmitter 24 will transmit a signal to receiver-indicator 18. The signal transmitted can be a signal similar to those transmitted for automatic garage door openers. So long as receiver-indicator 18 receives signals from transmitter 24, it continues to indicate to repairman 10 that power is still available at wall receptacle 22.

Once repairman 10 turns off the correct breaker box 16, power is no longer available at socket 22 and, therefore, at transmitter 24. Transmitter 24, once it no longer receives power from receptacle 22, stops transmitting its signal. Once receiver-indicator 18 no longer receives the transmitted signal from transmitter 24, it indicates to repairman 10 that power is no longer available at receptacle 22.

Figure 2:
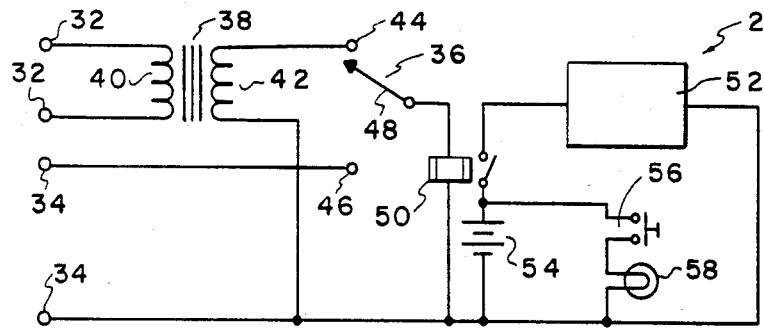
FIG. 2 is a schematic diagram of a transmitter according to this invention.

Many different embodiments of the transmitter, receiver and indicator are possible. Transmitter 24 includes a transmitting device 52 which, when activated, transmits signals receivable by the receiver. One embodiment of transmitter 24 is shown in FIG. 2 and comprises input terminals 32 for connecting the transmitter to a high voltage alternating current circuit to be tested and input terminals 34 for connecting the transmitter to a low voltage alternating current circuit to be tested as well as a manually operated selector switch 36 for selecting between the two inputs. Input terminals 32 for high voltage AC connect to stepdown transformer 38 with a high side 40 and a low side 42. Low side 42 connects to a switch contact 44 of switch 36. One of the input terminals 34 connects to the other switch contact 46. Lever 48 of switch 36 connects to a means for activating transmitting relay 50 which in this case is an AC relay which can be operated from the low voltage input at terminals 34 or the stepdown high voltage input at low side 42 of transformer 38. Transmitting device 52 can be operated from a power source as a battery 54 when relay 50 is closed. Connected across battery 54 is a push button 56 and a light 58 as one means for testing battery 54.

It can thus be seen that, if input terminals 34 are connected to a potential source for AC voltage, then the presence of the AC voltage in the correct voltage range will close relay 50, thus supplying the power from battery 54 to transmitting device 52 which in turn transmits a signal which can be received by a combination receiver-indicator 18.

Figure 3:
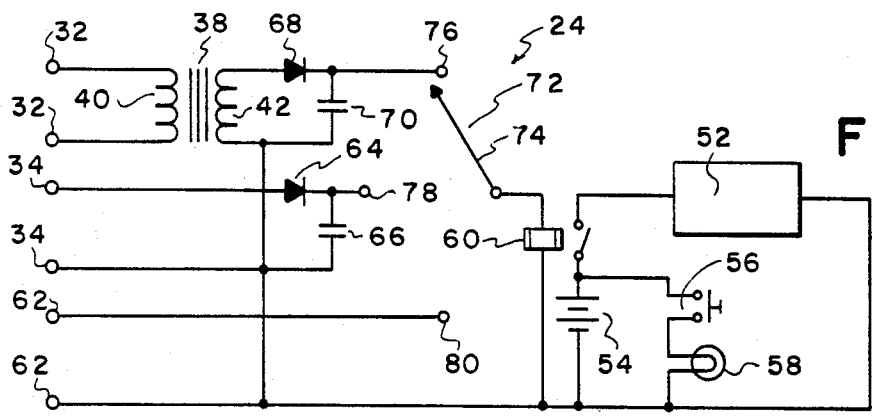
FIG. 3 is an alternative embodiment of a transmitter according to this invention.
Figure 4:
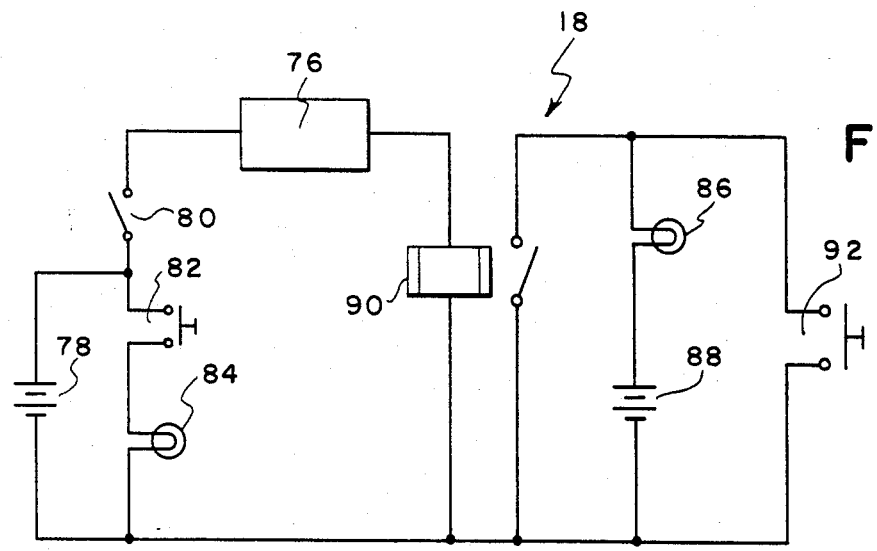
FIG. 4 is a schematic diagram of a combination receiver-indicator utilizing this invention.

Another embodiment of transmitter 24 is shown in FIG. 3 where similar elements are given the same numbers as in FIG. 1. The receiver shown in FIG. 3 utilizes a DC relay which can be activated from a DC voltage connected to input terminal 62 or from a smoothed half-wave rectified low voltage AC applied to input terminal 34 or from a smoothed half-wave rectified high voltage applied at input terminals 32. An AC input at terminals 34 would be smoothed and half-wave rectified by diode 64 and capacitor 66. Likewise, a stepped down AC voltage at low side 42 of transformer 38 is half-wave rectified and smoothed by diode 68 and capacitor 70. A selector switch 72 includes a lever 74 which can be manually set to select between contact 76 connected to the smoothed half-wave rectified stepped down AC voltage or contact 78 connected to the smoothed half-wave rectified AC voltage or contact 80 connected to the DC voltage. This transmitter embodiment can be used as part of a remote live circuit tester for both AC and DC circuits whereas the prior embodiment is primarily useful for AC circuits.

Combination receiver-indicator 18 includes a receiving device 76 for receiving radio signals transmitted from transmitting device 52. Transmitting device 52 can be operated from a power source such as a battery 78 when manually operable switch 80 is closed. Connected across battery 78 is a push button 82 and a light 84 for testing battery 78.

Combination receiver-indicator 18 also includes an indicating device such as light 86 along with some power source for the indicating device such as battery 88. The indicating device needs to have at least one discrete indicating state for every state of interest or group of states of interest of the circuit to be tested. For a remote live circuit tester, a light is adequate since it has both an on state and an off state corresponding to power being on or off at the circuit to be tested. Alternatively, the indicating device can have a continuous meter rather than discrete states. A continuous meter is especially suited for testing an electric circuit which can have a continuing range of values rather than discrete states to be tested.

Light 86 is responsive to the states received by the receiving device by a means for responding to the receiving device such as relay 90. Connected across battery 88 and light 86 is a push button 92 for testing the indicator.

It can thus be seen that, if one wishes to operate combination receiver-indicator 18, one need only close switch 80. To make sure that battery 78 is adequately charged, one pushes push button 82, and if the battery is adequately charged then light 84 lights giving a positive visual indication. Once receiving device 76 begins to receive radio signals from the appropriate transmitter, it closes the relay which in the case of a remote live circuit indicator is relay 90, thus lighting light 86 indicating that the remote circuit is live. Once transmitter 24 stops transmitting signals to receiving device 76, relay 90 opens, turning light 86 off. To make sure that light 86 is functioning properly, one pushes push button 92 which will test light 86. One then returns to the circuit to be tested and test that circuit with a voltmeter or other appropriate device as a safety precaution, but no extra trips between the remote circuit and the breaker box are necessary when the voltmeter and remote live circuit tester are both working properly.

An apparatus in accordance with this invention can be made responsive to any number of states rather than simply two states as illustrated. Likewise, it can be made responsive to a continuously variable state rather than discrete states. This can be done by having the transmitting and receiving devices responsive to a continuum of circuit values and an indicating device such as a meter with a continuously variable range.

From the foregoing it will be seen that this invention is one well adapted to attain all of the ends and objects hereinabove set forth, together with other advantages which are obvious and which are inherent to the apparatus.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth or shown in the accompanying drawings is to be interpreted as illustrative and not in a limiting sense.

The invention having been described, what is claimed is:

1. A remote live circuit tester for determining the condition of a circuit to be tested comprising, in combination:
    a transmitter with an input and an output responsive to the receipt of an electrical signal at the input, the output having two states, one state corresponding to power on in the circuit and one state corresponding to power off in the circuit,
    means for electrically connecting the circuit to be tested to the input of the transmitter,
    a receiver responsive to the output states transmitted from the transmitter, and
    an indicator responsive to the states received by the receiver
    whereby the state of the indicator indicates the condition of the circuit to be tested.

2. A tester according to claim 1 wherein the transmitter comprises, in combination:
    a transmitting device for transmitting signals receivable by the receiver, and
    a means responsive to the condition of the circuit to be tested for activating the transmitting device.

3. A remote live circuit tester according to claim 2 wherein the means for activating the transmitting device comprises a switch between the transmitting device and power for the transmitting device switchable by the circuit to be tested.

4. A remote live circuit tester according to claim 3 wherein the receiver comprises, in combination:
    a receiving device, and
    a means for responding to the receiving device, and
    wherein the indicator is responsive to the means for responding to the receiving device
    whereby the indicator is responsive to the signals received by the receiver.

5. A remote live circuit tester according to claim 4 wherein the means for responding to the receiving device comprises a switch between the indicator and power for the indicator switchable by the receiving device.

6. A remote live circuit tester according to claim 1 wherein the receiver comprises, in combination:
    a receiving device, and
    a means for responding to the receiving device, and wherein the indicator in responsive to the means for responding to the receiving device
whereby the indicator is responsive to the signals received by the receiver.

7. A remote live circuit tester according to claim 6 wherein the means for responding to the receiving device comprises a switch between the indicator and power for the indicator switchable by the receiving device.

* * * * *